(12) United States Patent
Lin et al.

(10) Patent No.: US 8,404,531 B2
(45) Date of Patent: Mar. 26, 2013

(54) METHOD FOR FABRICATING A POWER TRANSISTOR

(75) Inventors: Yung-Fa Lin, Hsinchu (TW); Shou-Yi Hsu, Hsinchu (TW); Meng-Wei Wu, Hsinchu (TW); Yi-Chun Shih, Hsinchu (TW); Main-Gwo Chen, Hsinchu (TW)

(73) Assignee: Anpec Electronics Corporation (TW)

( * ) Notice: Subject to any disclaimer, the term of this patent is extended or adjusted under 35 U.S.C. 154(b) by 0 days.

(21) Appl. No.: 13/349,038

(22) Filed: Jan. 12, 2012

(65) Prior Publication Data

US 2012/0252176 A1 Oct. 4, 2012

(30) Foreign Application Priority Data

Mar. 30, 2011 (TW) .............................. 100111039 A (51) Int. Cl.
*H01L 21/337* (2006.01)
(52) U.S. Cl. .................. 438/192; 438/212; 438/268
(58) Field of Classification Search .................. 438/192, 438/206, 209, 212, 268, 269, 270
See application file for complete search history.

(56) References Cited

U.S. PATENT DOCUMENTS

| | | | | |
|---|---|---|---|---|
| 2009/0130806 A1* | 5/2009 | Sedlmaier et al. | ............ | 438/192 |
| 2009/0149009 A1* | 6/2009 | Tischler | ........................ | 438/585 |
| 2011/0248352 A1* | 10/2011 | Shifren et al. | ................ | 438/223 |
| 2012/0018856 A1* | 1/2012 | Weyers et al. | ................ | 438/542 |

\* cited by examiner

*Primary Examiner* — Kevin M Picardat
(74) *Attorney, Agent, or Firm* — Stroock & Stroock & Lavan LLP (57) ABSTRACT

A method for fabricating a power transistor includes: (a) forming a trench in a substrate with a first electrical type; (b) diffusing second electrical type carriers into the substrate from the trench such that the substrate is formed into a first part and a second part that is diffused with the second electrical type carriers and that adjoins the trench, the first and second parts being crystal lattice continuous to each other; (c) forming a filling portion in the trench, the filling portion adjoining the second part; (d) performing a carrier-implanting process in the second part and the filling portion; and (e) forming over the substrate a gate structure that has a dielectric layer and a conductive layer.

14 Claims, 12 Drawing Sheets

METHOD FOR FABRICATING A POWER TRANSISTOR

CROSS-REFERENCE TO RELATED APPLICATION

This application claims priority of Taiwanese application no. 100111039, filed on Mar. 30, 2011.

BACKGROUND OF THE INVENTION

1. Field of the Invention

This invention relates to a method for fabricating a power transistor, more particularly to a method for fabricating a power transistor having a super junction.

2. Description of the Related Art

Figure 1:
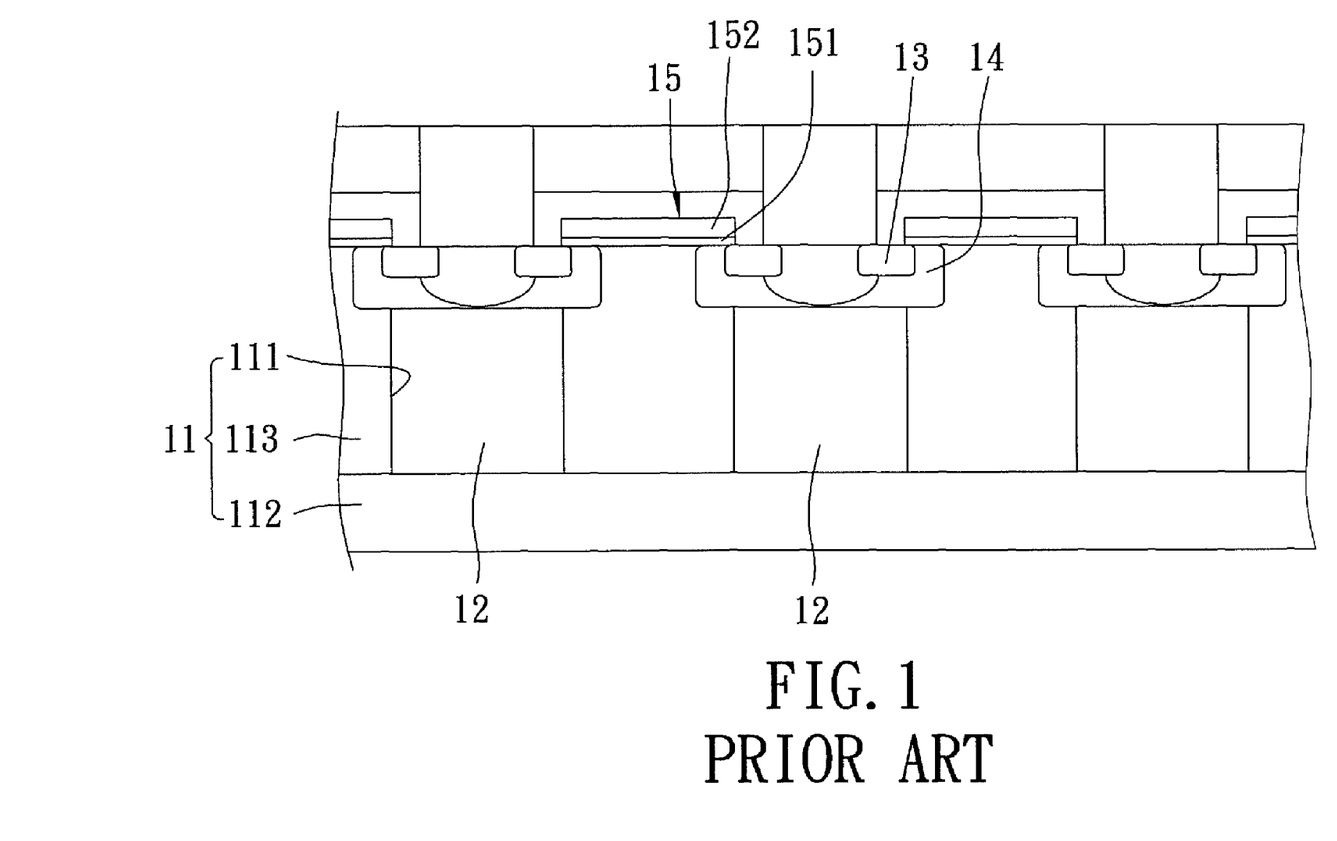
FIG. 1 is a fragmentary schematic side view of a semiconductor device that includes a plurality of conventional power transistors.

FIG. 1 illustrates a semiconductor device including a plurality of conventional power transistors, each of which includes a substrate 11, a main body region 12, a source region 13, a well region 14, and a gate structure 15.

The substrate 11 is epitaxially formed, has a first electrical type, and includes a lower portion 112, an upper portion 113, and a trench 111 that is indented from a top face of the upper portion 113 to reach the lower portion 112.

The main body region 12 and the well region 14 have the second electrical type, and are filled in the trench 111. The well region 14 is formed on and contacts the main body region 12. The source region 13 has the first electrical type and contacts the well region 14 and/or the main body region 12 so as to be separated from the substrate 11. An interface between the substrate 11 and the main body region 12 defines a super junction.

When the first electrical type is n-type, the second electrical type is p-type. On the contrary, when the first electrical type is p-type, the second electrical type is n-type.

The gate structure 15 is disposed on the top face of the upper portion 113, and includes a dielectric layer 151 formed on the top face of the upper portion 113, and a conductive layer 152 formed on the dielectric layer 151 and is spaced apart from the substrate 11 by the dielectric layer 151. The dielectric layer 151 is made of an insulative material, such as silicon dioxide or silicon nitride. The conductive layer 152 is made of a conductive material, such as metal or polycrystalline silicon.

The lower portion 112 of the substrate 11 serves as a drain, the well region 14 serves as a well, the source region 13 serves as a source, and the gate structure 15 serves as agate. The lower portion 112, the gate structure 15 and the source region 13 are adapted to receive electrical power from external circuit devices so that the power transistor can generate an electrical field using voltage differences.

When a predetermined voltage is applied on the conductive layer 152 of the gate structure 15 and the substrate 11 relative to the source region 13, the electrical charges from the lower portion 112 of the substrate 11 pass through the well region 14 and the source region 13 to form a conductive channel so that the power transistor actuates when the predetermined voltage is applied.

The conventional power transistor is formed by the following steps. Firstly, the substrate 11 is epitaxially grown to have the first electrical type and to include the lower portion 112 and the upper portion 113, and the upper portion 113 is etched to form the trench 111 therein.

Next, the trench 111 is filled with a filling material having the second electrical type using an epitaxial process. Thereafter, the dielectric layer 151 and the conductive layer 152 are sequentially formed on the top face of the upper portion 113 to form the gate structure 15.

An ion implantation process is conducted using the conductive layer 152 as a mask. To be specific, second electrical type carriers are implanted into the filling material in the trench 111 so as to form a well-forming region that is implanted with the second electrical type carriers, and the main body region 12 that is not implanted with the second electrical type carriers. Then, first electrical type carriers are implanted in the well-forming region so as to form the source region 13 that has the first electrical type, and the well region 14 that has the second electrical type.

However, since the trench 111 is formed by etching, the super junction between the substrate 11 and the main body region 12 is likely to be uneven, and thus is not crystal lattice continuous interface and has lattice defects. This may affect the transmission of the electrical charges when the power transistor is operated. Besides, because the super junction between the substrate 11 and the main body region 12 is a heterogeneous interface, the electrical charges may be trapped and accumulated in the super junction. Therefore, leakage current may occur when the power transistor is standby, and thus, the conventional power transistor may have poor current stability and reliability.

SUMMARY OF THE INVENTION

Therefore, an object of the present invention is to provide a method for fabricating a power transistor that can overcome the aforesaid drawbacks associated with the prior art.

Accordingly, a method for fabricating a power transistor of this invention comprises:

(a) forming a trench in a substrate with a first electrical type;

(b) diffusing second electrical type carriers into the substrate from the trench such that the substrate is formed into a first part that is not diffused with the second electrical type carriers and that has the first electrical type, and a second part that is diffused with the second electrical type carriers, that has a second electrical type, and that adjoins the trench and separates the first part from the trench, the first and second parts being crystal lattice continuous to each other;

(c) forming a filling portion in the trench, the filling portion adjoining the second part;

(d) performing a carrier-implanting process in the second part and the filling portion so as to form a source region having the first electrical type, and a well region contacting the source region and having the second electrical type; and (e) forming over the substrate a gate structure that has a dielectric layer and a conductive layer.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Before the present invention is described in greater detail with reference to the accompanying preferred embodiments, it should be noted herein that like elements are denoted by the same reference numerals throughout the disclosure.

Figure 2:
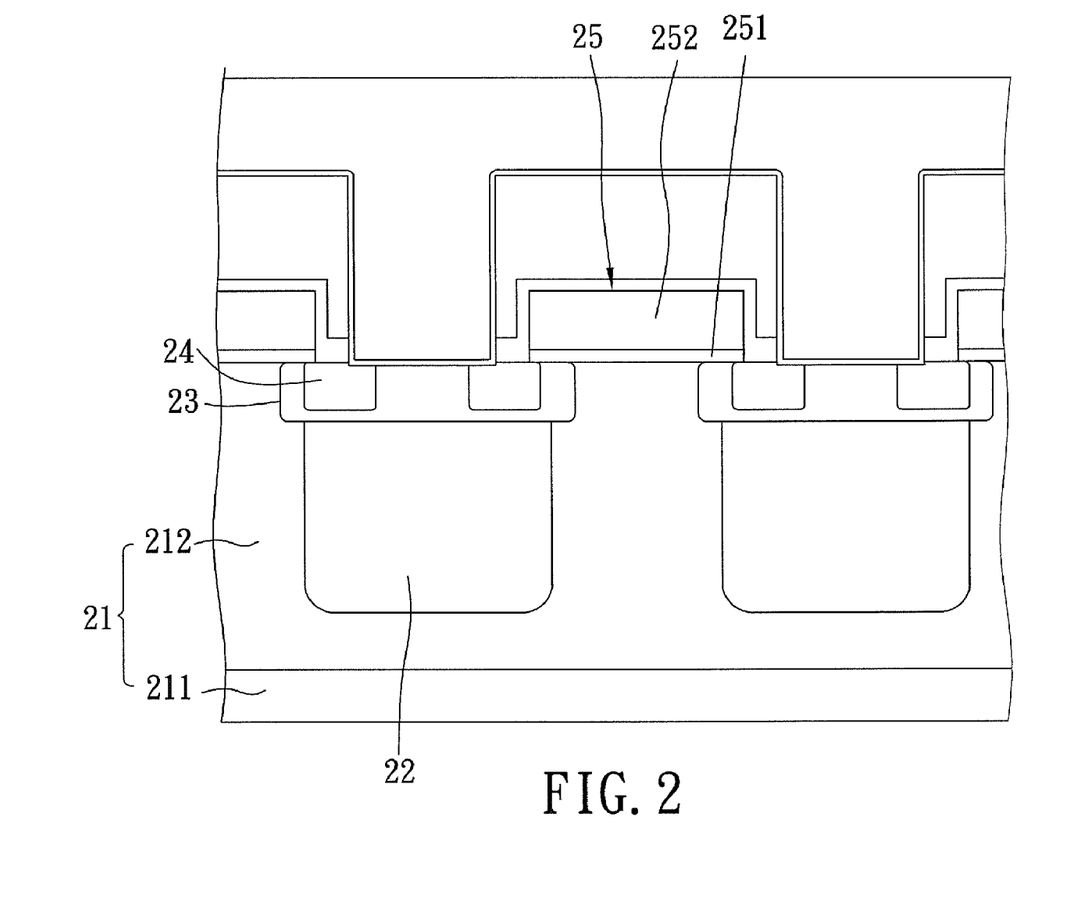
FIG. 2 is fragmentary schematic side view of a semiconductor device that includes a plurality of power transistors fabricated by a method for fabricating a power transistor according to this invention.

Referring to FIG. 2, the preferred embodiment of a semiconductor device according to this invention includes a plurality of power transistors, each of which includes a substrate 21, a main body region 22, a well region 23, a source region 24, and a gate structure 25.

The substrate 21 has a first electrical type, and includes a lower portion 211 that is grown epitaxially and an upper portion 212 that is formed on the lower portion 211. The lower portion 211 has a majority carrier concentration not less than that of the upper portion 212.

The main body region 22 is made of a second electrical type semiconductor, and is formed in the upper portion 212 of the substrate 21. The second electrical type is opposite to the first electrical type. The main body region 22 and the upper portion 212 are crystal lattice continuous to each other at an interface therebetween to form a super junction.

The well region 23 has the second electrical type, and is disposed on and contacts the main body region 22. In the preferred embodiments of this invention, the first electrical type is n-type, and the second electrical type is p-type. The n-type and p-type are simply used to distinguish the electrical properties of semiconductors, and thus, when the first electrical type is p-type, the second electrical type is n-type.

The source region 24 has the first electrical type, and is formed in and contacts the well region 23. The source region 24 has a majority carrier concentration not less than that of the upper portion 212.

The gate structure 25 is formed on a top face of the upper portion 212, and includes a dielectric layer 251 that contacts the upper portion 212, and a conductive layer 252 that is formed on the dielectric layer 251 and is spaced apart from the substrate 21 by the dielectric layer 251. The dielectric layer 251 is made of an insulative material selected from silicon dioxide, silicon nitride, and a combination thereof. The conductive layer 252 is made of a conductive material selected from metals, polycrystalline silicon, and combinations thereof.

The lower portion 211 of the substrate 11 serves as a drain, the well region 23 serves as a well, the source region 24 serves as a source, and the gate structure 25 serves as a gate.

When a predetermined voltage is applied on the conductive layer 252 of the gate structure 25 and the substrate 21 relative to the source region 24, the electrical charges (electrons) from the lower portion 211 of the substrate 21 pass through the well region 23 and the source region 24 to form a conductive channel so that the power transistor is actuated when a relatively high voltage is applied.

Figure 3:
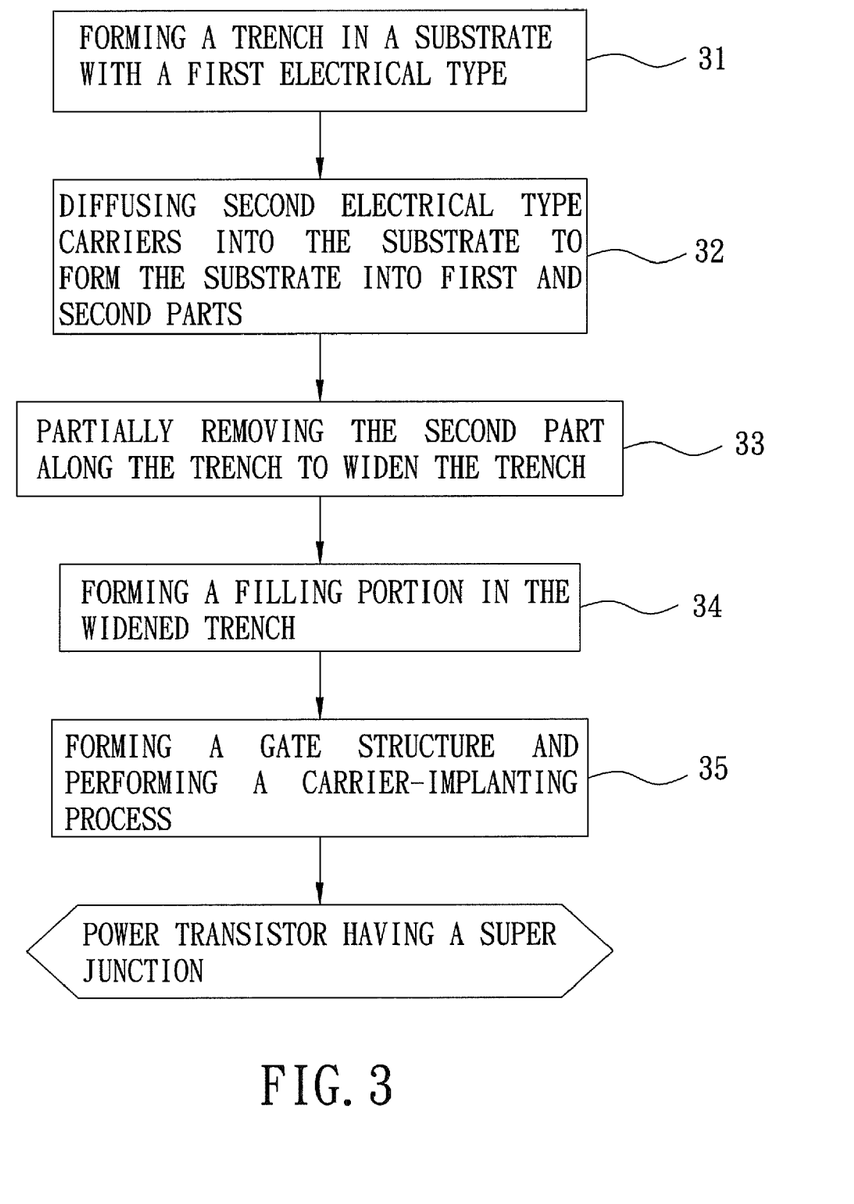
FIG. 3 is a flowchart illustrating the first preferred embodiment of a method for fabricating a power transistor according to this invention.

Referring to FIG. 3, the first preferred embodiment of a method for fabricating a power transistor according to this invention includes five steps (i.e., steps 31 to 35). In the following, the elements are described in singular form for clarity.

Figures 4, 5:
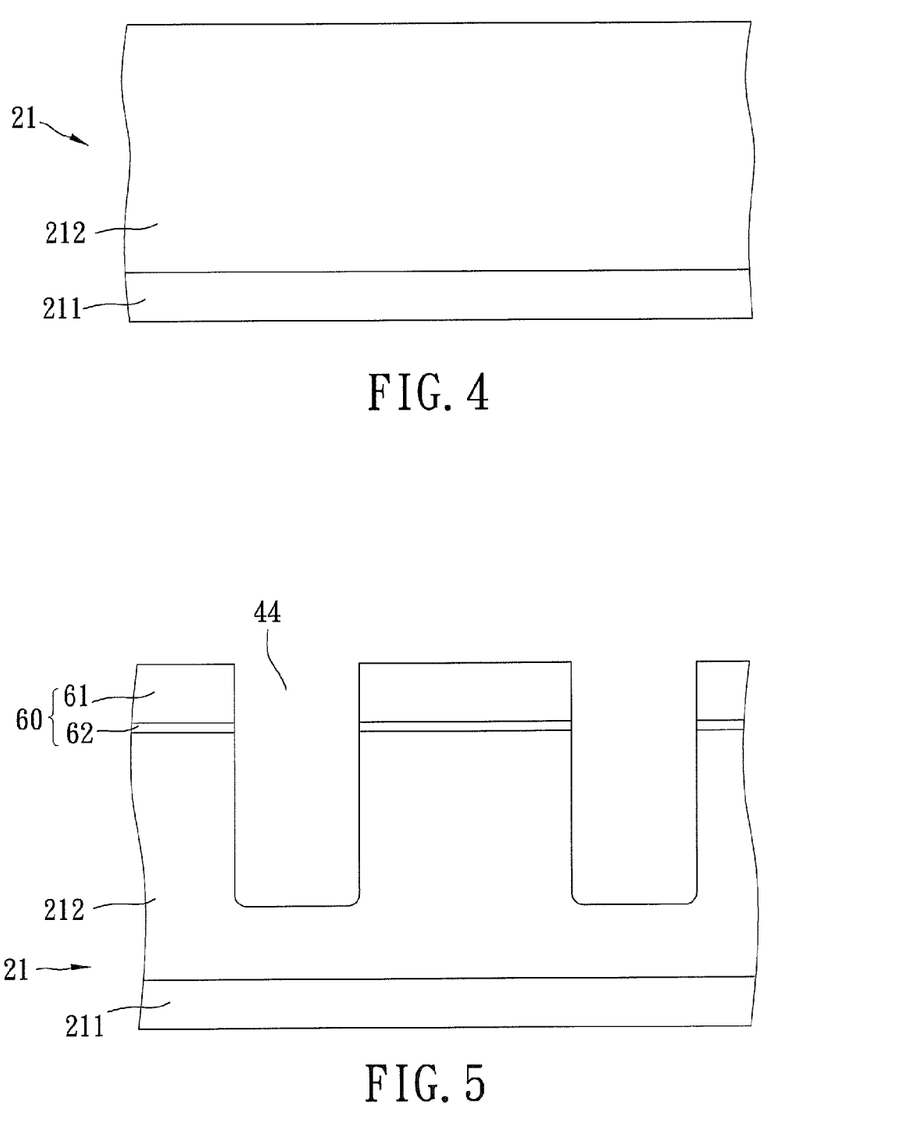
FIGS. 4 to 12 are fragmentary schematic side views illustrating consecutive steps of the method of FIG. 3.

In step 31, a lower portion 211 and an upper portion 212 are epitaxially grown to obtain a substrate 21, and the substrate 21 is mainly constituted by silicon and has the first electrical type (see FIG. 4). The lower portion 211 has a majority carrier concentration greater than that of the upper portion 212. Then, as shown in FIG. 5, a silicon oxide layer 62 and a silicon nitride layer 61 are sequentially formed to obtain a hard mask 60 on a top face of the upper portion 212, the hard mask 60 is patterned by a lithography process, and the upper portion 212 exposed from the patterned hard mask 60 is subjected to an etching process to form a trench 44. The trench 44 extends downwardly from the top face of the upper portion 212 to the lower portion 211.

Figure 6:
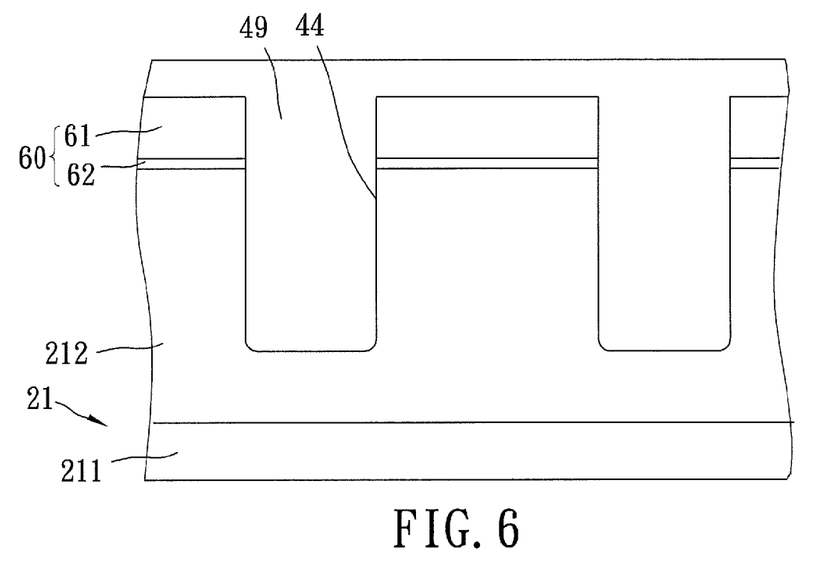
Figure 7:
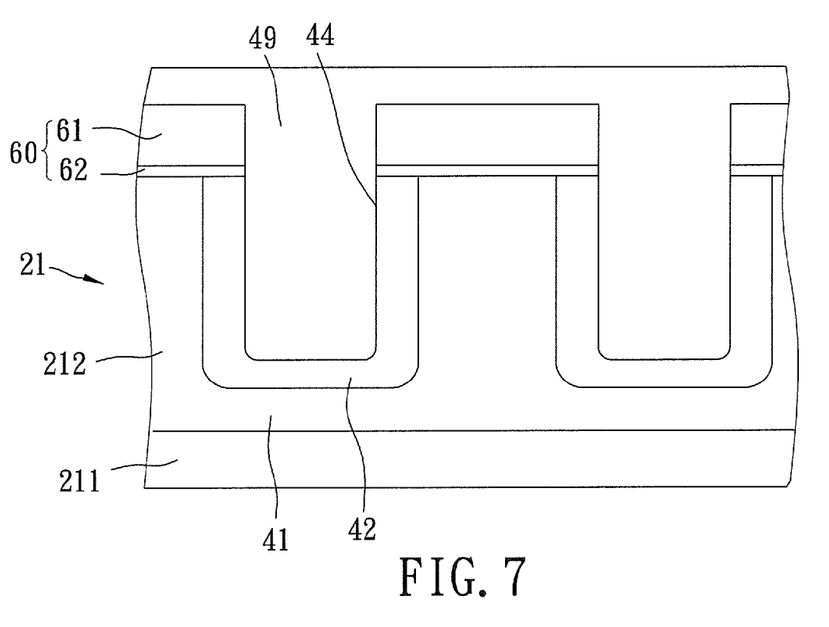

In step 32, a carrier-diffusing material 49, which contains the second electrical type carriers, is filled into the trench 44 and heated so that the second electrical type carriers of the carrier-diffusing material 49 diffuse into the substrate 21, thereby forming the substrate 21 into a first part 41 and a second part 42 (see FIGS. 6 and 7). The first part 41 is not diffused with the second electrical type carrier and has the first electrical type. The second part 42 is diffused with the second electrical type carriers, has a second electrical type, and adjoins the trench 44 and separates the first part 41 from the trench 44. The first and second parts 41, 42 are crystal lattice continuous to each other, and cooperatively define a super junction at an interface therebetween. In this preferred embodiment, the carrier-diffusing material 49 is selected from borosilicate glass (BSG), gallium-doped silica glass, group IIIA element-doped silica glass, and combinations thereof. Preferably, examples of the group IIIA element that are suitable for this invention include gallium and indium. Thereafter, the carrier-diffusing material 49 in the trench 44 is removed.

It is noted that because the second electrical type carriers diffuse from a wall surface that defines the trench 44 into the substrate 21, the second part 42 has a majority carrier concentration that is gradually reduced from the wall surface to the first part 41. That is to say, a portion of the second part 42, which immediately adjoins the trench 44, has the highest carrier concentration.

In this preferred embodiment, the second electrical type carriers are diffused into the substrate 21 using the carrier-diffusing material 49. Alternatively, the second electrical type carriers may be diffused into the substrate 21 by: (1) an ion-implanting process to control the carrier concentration of the second part 42, or (2) heating the second electrical type carriers which are in the form of gas and which are filled in a furnace tube to introduce the second electrical type carriers into the substrate 21. The ion-implanting process, and the heating and introducing processes using the furnace tube are well-known in the art, and detailed descriptions thereof are omitted herein for the sake of brevity.

Figure 8:
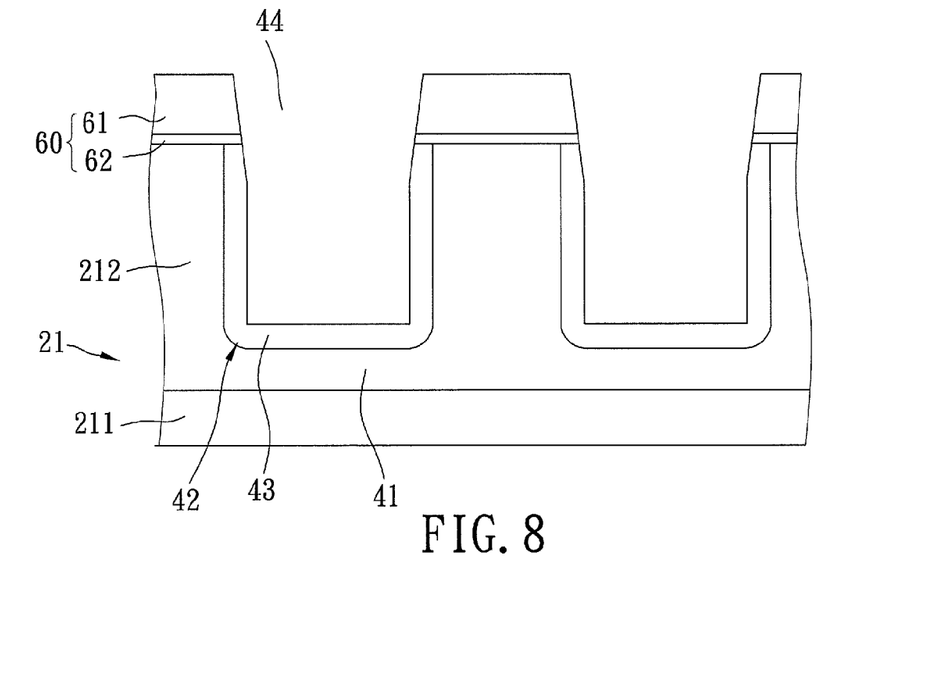

In step 33, the portion of the second part 42 that immediately adjoins the trench 44 is removed so that the trench 44 has a widened width. The widened trench 44 formed in the step 33 has a depth larger than the widened width (see FIG. 8). Preferably, an aspect ratio of the depth to the widened width is greater than 5. In this step, the portion of the second part 42, which adjoins the trench 44 and which has the highest carrier concentration, is removed so that a concentration gradient of the second electrical type carriers in the second part 42 becomes smaller. In FIG. 8, only a remaining portion 43 of the second part 42 is shown.

Figure 9:
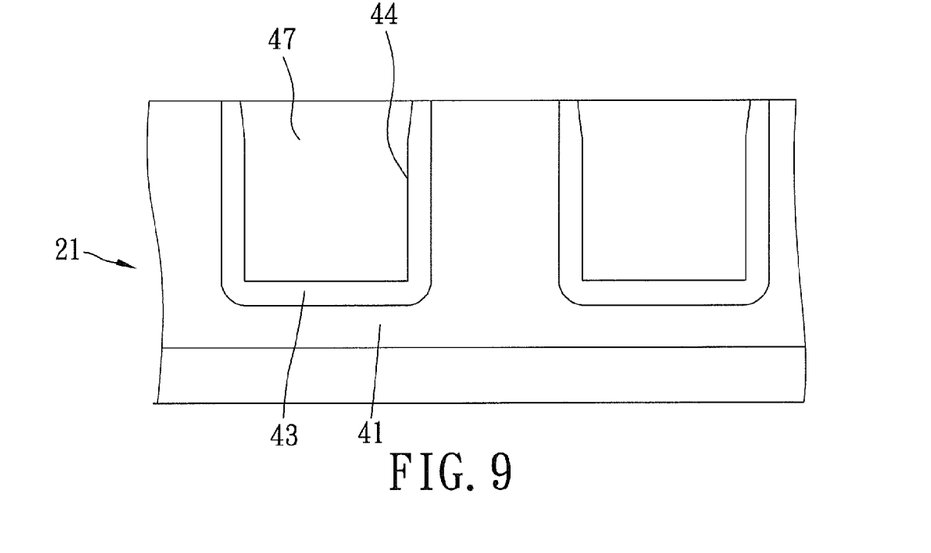

In step 34, the patterned hard mask 60 is removed, and a filling portion 47 is epitaxially formed in the widened trench 44 to adjoin the remaining portion 43 of the second part 42 (see FIG. 9). The filling portion 47 is constituted by a semiconductor material, and has a majority carrier concentration lower than or close to that of the remaining portion 43 of the second part 42. When the majority carrier concentration of the filling portion 47 is lower than that of the remaining portion 43, the filling portion 47 may be made of a neutral semiconductor material, and the second electrical type carriers in the remaining portion 43 of the second part 42 will diffuse into the filling portion 47. Because the portion of the second part 42, which has the highest carrier concentration, is removed, the filling portion 47 may have the majority carrier concentration close to that of a part of the remaining portion 43 that immediately adjoins the widened trench 44. Therefore, the filling portion 47 can be formed from a material with the second electrical type, a neutral semiconductor material, or a combination thereof.

Figure 10:
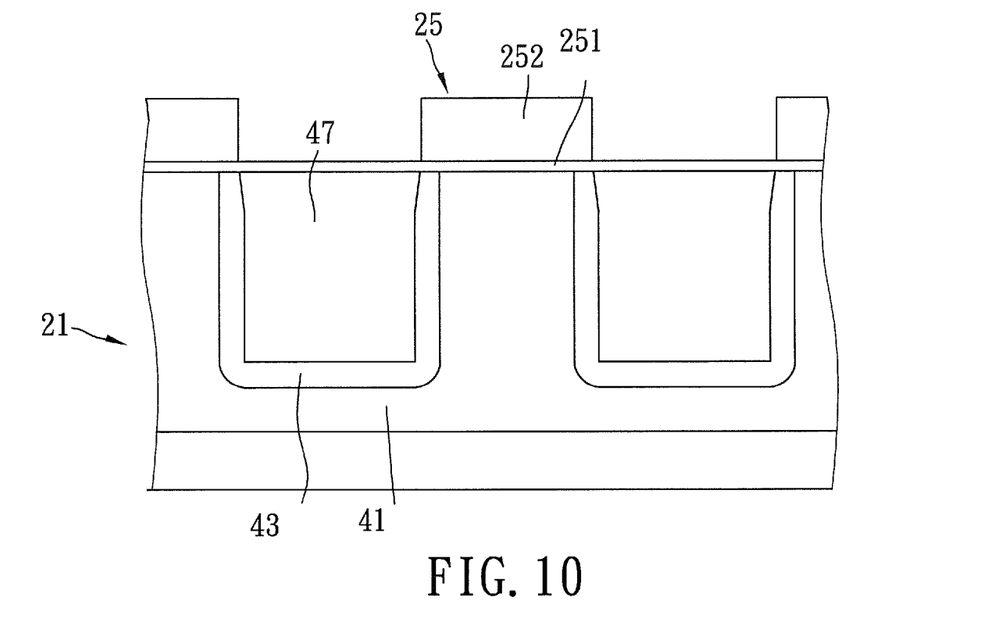

In step 35, a dielectric layer 251 that is made of an insulative material is formed over the first part 41, and thereafter, a conductive layer 252 is formed on the dielectric layer 251 to obtain a gate structure 25 (see FIG. 10). The conductive layer 252 is spaced apart from the first part 41 by the dielectric layer 251.

Figure 11:
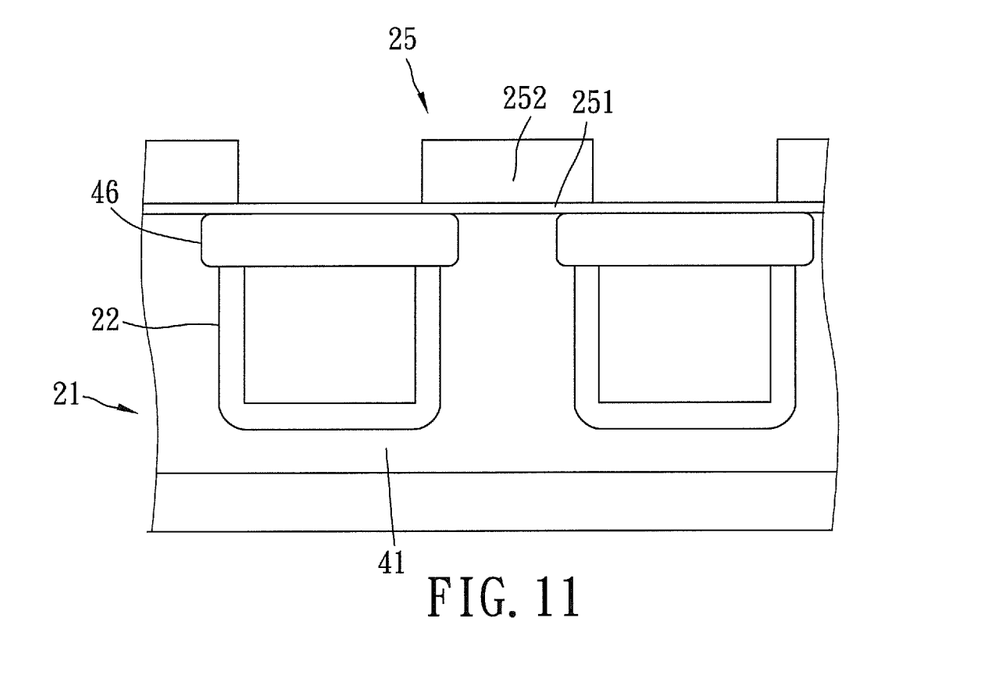
Figure 12:
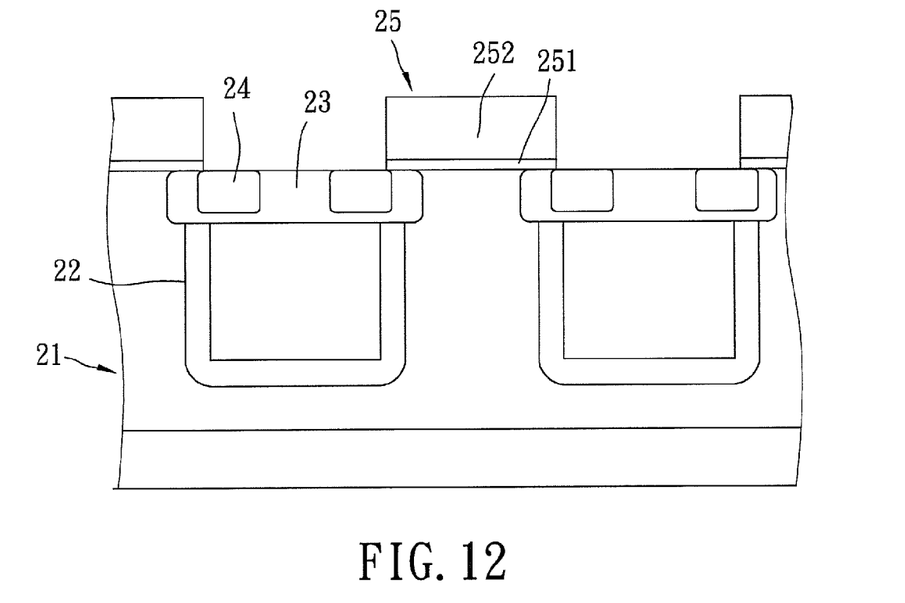

Then, referring to FIG. 11, the second electrical type carriers are implanted from a surface cooperatively defined by the remaining portion 43 and the filling portion 47 and into the remaining portion 43 and the filling portion 47 to form a well-forming region 46. The remaining portion 43 and the filling portion 47 that are not ion-implanted are formed into a main body region 22. Further referring to FIG. 12, the first electrical type carriers are implanted into the well-forming region 46 so that the well-forming region 46 is formed into the well region 23 that has the second electrical type and the source region 24 that has the first electrical type. Accordingly, the power transistor of this invention is obtained, in which an interface between the substrate 21 and the main body region 22 form the super junction and are crystal lattice continuous to each other.

In the first preferred embodiment, the second electrical type carriers are diffused into the substrate 21 using the carrier-diffusing material 49, followed by removing the carrier-diffusing material 49 and the portion of the second part 42, which adjoins the trench 44 and which has the highest carrier concentration. The carrier concentration of the remaining portion 43 of the second part 42 is further adjusted by forming the filling portion 47 in the widened trench 44. Therefore, the concentration gradient of the second electrical type carriers in the main body region 22, which is constituted by the remaining portion 43 and the filling portion 47, is smoothly and gradually changed. Besides, the super junction between the substrate 21 and the main body region 22 is a crystal lattice continuous surface. Accordingly, when the power transistor of this invention is operated, the electrical charges can move smoothly and are not liable to be trapped in the super junction, and the lateral movement of the electrical charges can be limited.

Furthermore, because the widened trench 44 has the depth larger than the widened width, the upper portion 21 and the filling portion 47 can have relatively large volumes, thereby improving withstand voltage characteristics of the power transistor when operating. Therefore, the aspect ratio of the depth to the widened width of the widened trench 44 is preferably greater than 5.

Figure 13:
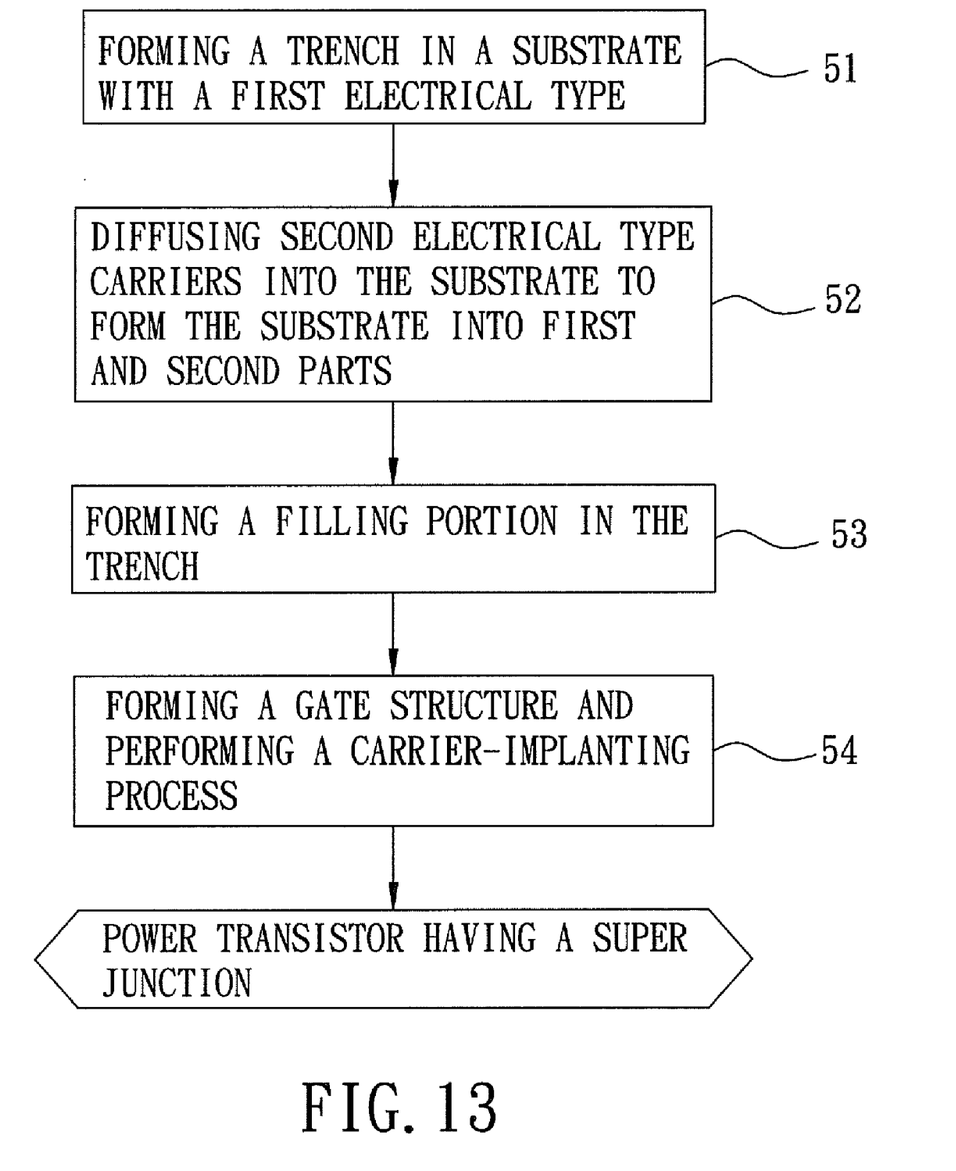
FIG. 13 is a flowchart illustrating the second preferred embodiment of a method for fabricating a power transistor according to this invention.

Referring to FIG. 13, the second preferred embodiment of a method for fabricating a power transistor according to this invention includes four steps (i.e., steps 51 to 54).

Step 51 is similar to step 31 (see FIGS. 3 and 5), except that an aspect ratio of a depth of the trench 44 to the width of the trench 44 is greater than 5.

Step 52 is the same as step 32 (see FIGS. 3, 6 and 7). After this step, the carrier-diffusing material 49 is removed.

Figure 14:
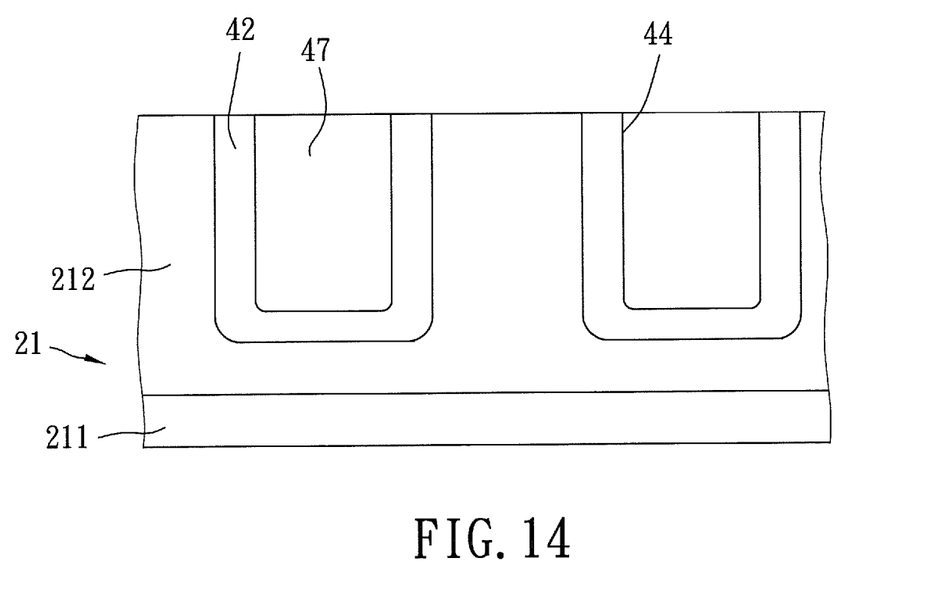
FIGS. 14 to 17 are fragmentary schematic side views illustrating consecutive steps of the method of FIG. 13.

Step 53 is similar to step 34. As shown in FIG. 14, because, in the second preferred embodiment, the portion of the second part 42, which adjoins the trench 44 and which has the highest carrier concentration, is not removed, the carrier concentration of the filling portion 47 should be lower than or similar to that of the second part 42. Besides, in this step, the diffusion of the second electrical type carriers between the filling portion 47 and the second part 42 are performed under heating until the second electrical type carriers do not move at a great extent.

Figure 15:
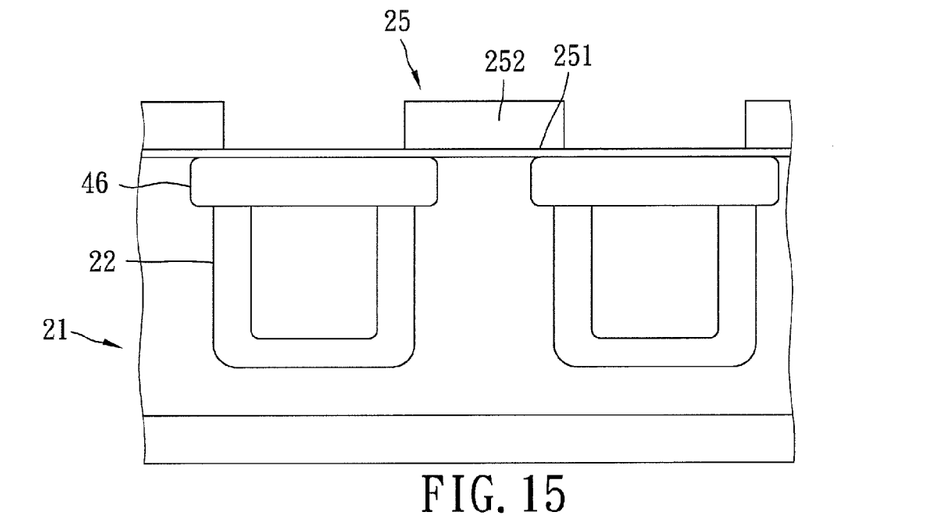
Figure 16:
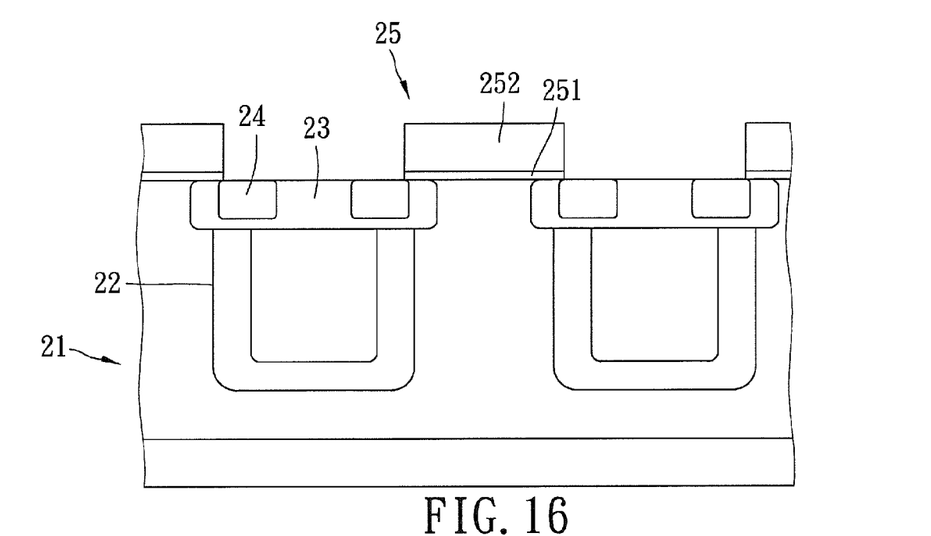

As shown in FIGS. 15 and 16, step 54 is the same as step 35 (also see FIG. 3).

Figure 17:
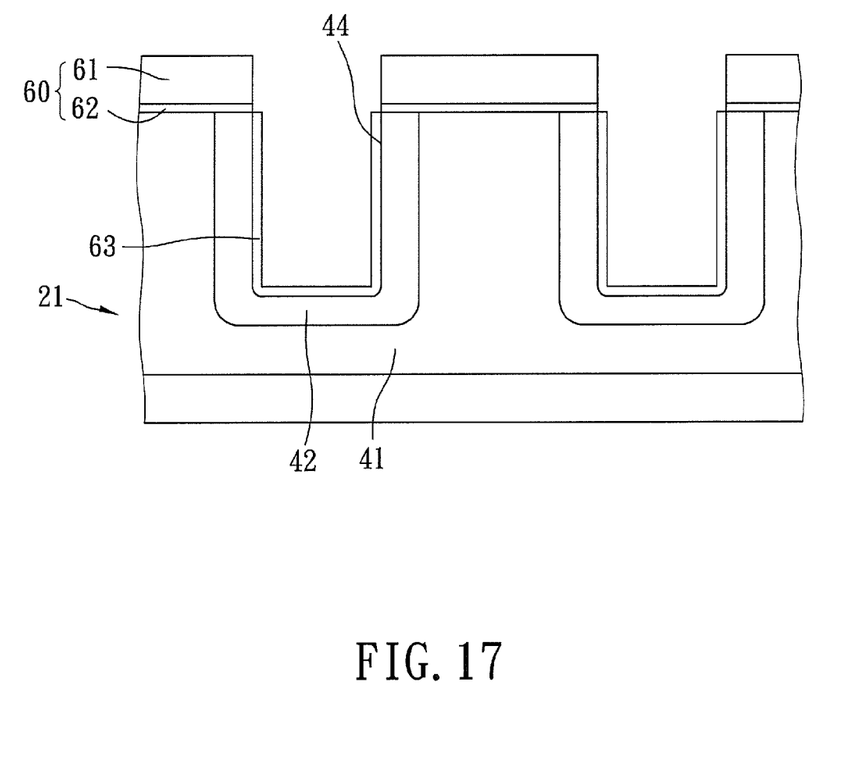

Alternatively, in the second preferred embodiment, the method may further include a step of forming a buffer layer 63 over a wall surface that defines the trench 44 (see FIG. 17), before the step 52. The buffer layer 63 is capable of controlling the diffusion of the second electrical type carriers into the substrate 21 in the step 52 and controlling a width of the second part 42, and is made of a material selected from the group consisting of silicon oxide, silicon nitride, and a combination thereof. Besides, with the buffer layer 63, a portion of the second part 42, which adjoins the trench 44, will not have the highest carrier concentration. After the step 52, the buffer layer 63 is removed.

It should be noted that because the filling portion 47 is epitaxially grown after the patterned hard mask 60 is removed, the filling portion 47 is less susceptible to be formed into an amorphous phase (for example, amorphous silicon) due to different crystal lattices between the hard mask 60 and the substrate 21.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for fabricating a power transistor, comprising:
   (a) forming a trench in a substrate with a first electrical type;
   (b) diffusing second electrical type carriers into the substrate from the trench such that the substrate is formed into a first part that is not diffused with the second electrical type carriers and that has the first electrical type, and a second part that is diffused with the second electrical type carriers, that has a second electrical type, and that adjoins the trench and separates the first part from the trench, the first and second parts being crystal lattice continuous to each other;
   (c) forming a filling portion in the trench, the filling portion adjoining the second part;
   (d) performing a carrier-implanting process in the second part and the filling portion so as to form a source region having the first electrical type, and a well region contacting the source region and having the second electrical type; and
   (e) forming over the substrate a gate structure that has a dielectric layer and a conductive layer.

2. The method of claim 1, before step (c), further comprising:
(f) partially removing the second part along the trench so that the trench has a widened width.

3. The method of claim 1, wherein the filling portion is formed from a material selected from the group consisting of a material with second electrical type, a neutral semiconductor material, and a combination thereof.

4. The method of claim 1, wherein the filling portion is epitaxially formed in the trench.

5. The method of claim 1, wherein the step (b) is conducted by filling and heating a carrier-diffusing material containing the second electrical type carriers in the trench, so that the second electrical type carriers of the carrier-diffusing material diffuse into the substrate, followed by removing the carrier-diffusing material in the trench.

6. The method of claim 2, wherein the widened trench formed in the step (f) has a depth larger than the widened width.

7. The method of claim 6, wherein a ratio of the depth to the widened width is greater than 5.

8. The method of claim 1, wherein the step (d) is conducted by implanting the second electrical type carriers into the second part and the filling portion so as to form a well-forming region with the second electrical type, followed by implanting first electrical type carriers into the well-forming region so that the well-forming region is formed into the well region and the source region.

9. The method of claim 1, wherein the step (a) is conducted by forming over the substrate a patterned hard mask, followed by etching the substrate exposed from the patterned hard mask to form the trench, the substrate and the patterned hard mask being made of different materials.

10. The method of claim 1, wherein the filling portion formed in the step (c) is constituted by a semiconductor material and has a carrier concentration lower than that of the second part so that the second electrical type carriers in the second part diffuse toward the filling portion.

11. The method of claim 10, wherein diffusion of the second electrical type carriers in the second part is performed under heating.

12. The method of claim 1, wherein the trench formed in the step (a) has a depth that is larger than a width thereof.

13. The method of claim 12, wherein a ratio of the depth to the width is greater than 5.

14. The method of claim 1, before step (b), further comprising:
(g) forming a buffer layer over a wall surface that defines the trench, the buffer layer being capable of controlling the diffusion of the carriers into the substrate in the step (b), and being made of a material selected from the group consisting of silicon oxide, silicon nitride, and a combination thereof.

* * * * *